Figure 1:
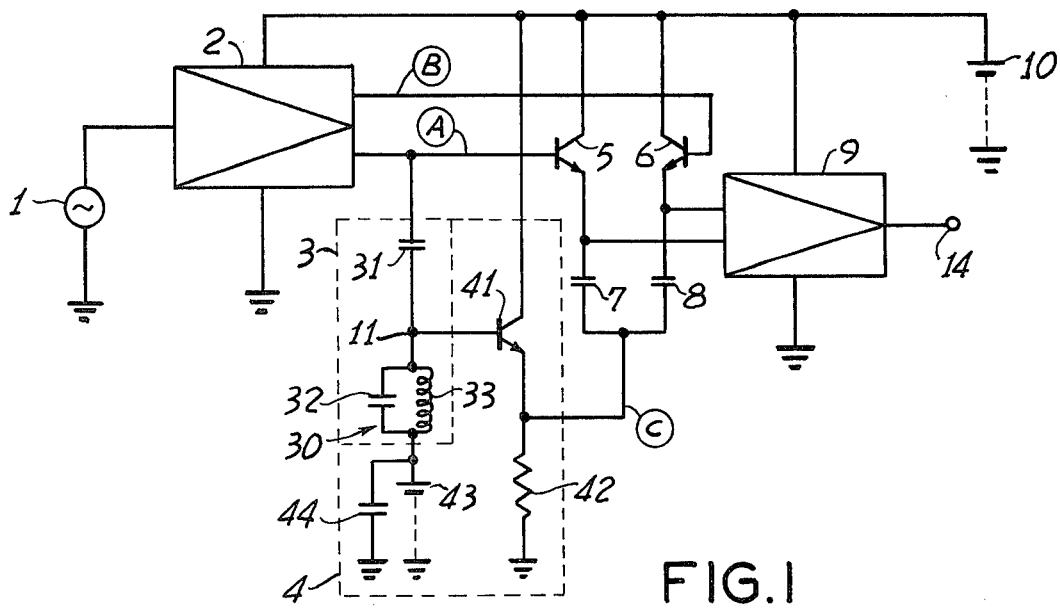

United States Patent [19]
Sugawara

[11] 4,119,919
[45] Oct. 10, 1978

[54] FREQUENCY DISCRIMINATOR CIRCUIT

[75] Inventor: Mitsutoshi Sugawara, Tokyo, Japan

[73] Assignee: Nippon Electric Co., Ltd., Tokyo, Japan

[21] Appl. No.: 844,981

[22] Filed: Oct. 25, 1977

[30] Foreign Application Priority Data

Oct. 26, 1976 [JP] Japan .................................. 51-129197

[51] Int. Cl.² ............................................. H03D 3/22
[52] U.S. Cl. ................................ 329/103; 307/233 R; 329/137; 329/140; 329/145
[58] Field of Search ................. 329/103, 137, 140–143, 329/145, 129, 130; 307/233 R; 325/349; 328/140, 141

[56] References Cited
U.S. PATENT DOCUMENTS
3,586,986  6/1971  Martens et al. .................. 329/140 X

*Primary Examiner*—Siegfried H. Grimm
*Attorney, Agent, or Firm*—Hopgood, Calimafde, Kalil, Blaustein & Lieberman

[57] ABSTRACT

A frequency discriminator circuit suitable for fabrication in a semiconductor integrated circuit has an input terminal connected to an input amplifier for producing two signals of opposite phase which are, respectively, applied to the base electrodes of two common-collector connected transistors. One of the two signals is also applied through a phase shifter to the emitters of both transistors. An output differential amplifier has its inputs connected, respectively, to the emitters of the two transistors to produce a frequency-discriminated output signal.

5 Claims, 5 Drawing Figures

$f_i = f_o$
$\therefore \theta = 90°$ $f_i > f_o$
$\therefore \theta < 90°$ $f_i < f_o$
$\therefore \theta > 90°$

FREQUENCY DISCRIMINATOR CIRCUIT

The present invention relates to a frequency discriminator circuit, and more particularly to a frequency discriminator circuit adapted to be realized in the form of a semiconductor integrated circuit.

Heretofore, various frequency discriminator circuits have been employed for demodulation of a frequency-modulated wave for automatic frequency control (AFC), and for other purposes. A Foster-Seeley discriminator and a ratio detector are examples of prior art frequency discriminator circuits in which a frequency-modulated wave received by a primary tuning circuit is detected by diodes at the opposite ends, of a secondary tuning circuit, and the difference between these detected outputs is derived. However, these prior art discriminator circuits require the use of many coils and many capacitors having large capacities. A coil or a capacitor having a large capacity cannot be formed on a semiconductor chip, so that these prior art circuits have a disadvantage that many electrode terminals for connecting the coils and capacitors are required on a semiconductor chip, and thus they are entirely unsuitable for realization in the form of a semiconductor integrated circuit.

Recently, frequency discriminators suitable for realization in a semiconductor integrated circuit have been proposed. One such discriminator is a differential peak detector system as disclosed, for example, in U.S. Pat. No. 3,519,944, in which the signals at the opposite ends of a phase shifter are respectively applied to the input terminals of a differential amplifier through an envelope detector. Such differential peak detector necessitates as additional elements only a single coil and one capacitor for the phase shifter and thus has a circuit construction that is suitable for forming as a semiconductor integrated circuit. In this instance, the number of electrode terminals required for connecting the coil and the capacitor is at most two, and is thus relatively small. However, since a resistor is required in the phase shifter, the sensitivity of discrimination is low. Another known system that is suitable to be formed as a semiconductor integrated circuit is a quadrature detection system, in which an input signal is directly, and via a phase-shifter, applied respectively to an AND gate or to an OR gate and the gated output is integrated (see U.S. Pat. No. 3,548,326). In this detection system also, while the number of electrode terminals required for the connection of the coils and the like is three and this system is relatively suitable for being formed as a semiconductor integrated circuit, when this system is realized as a semiconductor integrated circuit the designer is compelled either to sacrifice output off-set voltage or a detection sensitivity. More particularly, when an input signal is higher than a sufficient level for operation, a detector output is determined by the quality factor Q of the phase shifter and the D.C. gain of the AND or OR gate, but the quality factor Q of the phase shifter has a fixed upper limit, and thus cannot be increased excessively. Therefore, there is a disadvantage that if the D.C. gain of the AND or OR gate is enhanced in order to raise the detection sensitivity, then the output off-set voltage is increased.

The principal object of the present invention is to provide a frequency discriminator circuit which has a high sensitivity and a low off-set voltage, and is suitable for formation as a semiconductor integrated circuit.

According to one feature of the present invention, there is provided a frequency discriminator circuit comprising an input stage amplifier responsive to an input signal for obtaining first and second signals which have a reverse phase relationship from each other, a phase shifter for shifting the phase of the first signal by 90°, a first transistor arranged in a common collector circuit and having its base supplied with the first signal, a second transistor arranged in a common collector circuit and having its base supplied with the second signal, first and second capacitors having their one ends connected to the emitters of the first and second transistors, respectively, and the other ends both coupled to the output of the phase shifter, and a differential amplifier having the emitter outputs of the first and second transistors, respectively, applied to its inputs.

According to the present invention since only a single coil is required in the phase shifter circuit, the frequency discriminator circuit has a circuit construction that is highly suitable for fabrication as a semiconductor integrated circuit. The capacities of the first and second capacitors are so small that the capacitors can be formed within a semiconductor chip, and also the number of electrode terminals required for mounting a coil externally is at most one or two so that the area of the chip will not be enlarged due to the electrode terminals. In addition, according to the present invention, a frequency discriminator circuit having a high sensitivity and a low output off-set voltage can be obtained by lowering the gain of the differential amplifier output circuit while sufficiently enhancing the output level of the input stage, because the detector output is increased in proportion to the input signal.

Figure 2A:
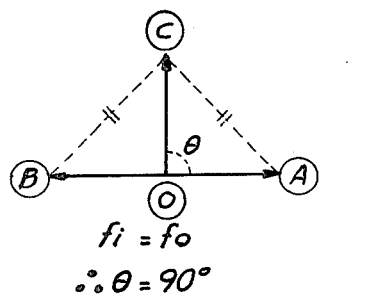
Figure 2B:
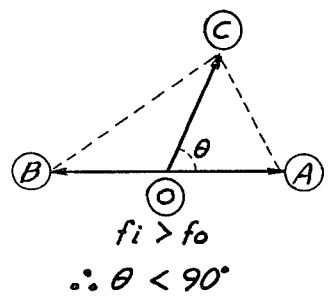
Figure 2C:
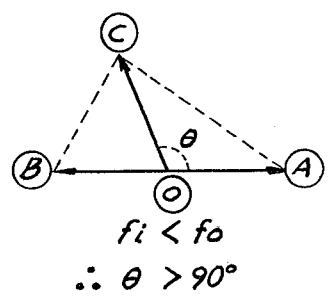
Figure 3:
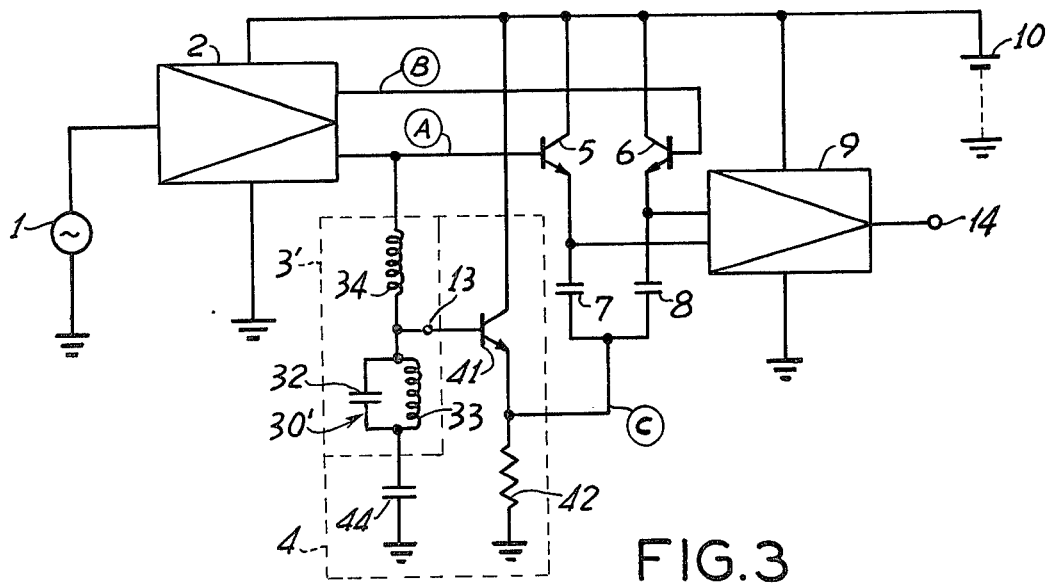

The present invention is now described in greater detail with reference to the accompanying drawings, in which:

FIG. 1 is a circuit diagram showing a frequency discriminator circuit according to a first embodiment of the present invention;

FIGS. 2(a), 2(b) and 2(c) are vector diagrams explaining the operations of the present invention; and FIG. 3 is a circuit diagram showing a second embodiment of the present invention.

Referring now to FIG. 1 showing a circuit arrangement according to a first embodiment of the present invention, a frequency modulated signal or an A.C. signal with a controlled frequency is fed from an input signal source 1 and applied to an input stage amplifier 2 in which a differential amplifier is used at least at its output portion. After the input signal has been amplified and subjected to amplitude limitation in the input stage 2 two distinct signals having a phase difference of 180° from each other are synthesized in the differential amplifier and obtained at internal points A and B. To the internal point A is connected a phase shifter 3 consisting of a capacitor 31 and a tuned circuit 30. The tuned circuit 30 has a parallel circuit of a capacitor 32 and a coil 33 and its resonant frequency is tuned to the center frequnecy of the frequency discriminator circuit. Therefore, when the input signal has the same frequency as the resonant frequency of the tuned circuit 30, a signal having a phase difference of 90° from the signal obtained at the internal point A is derived at a junction point 11 between the capacitor 31 and the tuned circuit 30. A base of an emitter-follower transistor 41 provided with an emitter resistor 42 is connected to the junction point 11, and the other end of the tuned circuit 30 of the capacitor 32 and the coil 33 is connected to a base bias source 43 and a capacitor 44 connected in parallel thereto, which are grounded at their opposite ends. The above-referred signals obtained at the internal points A and B, respectively, are applied to the respective bases of transistors 5 and 6 whose collectors are connected in common to a positive terminal of a power source 10. To the emitters of these transistors 5 and 6 is applied a signal obtained at the emitter of the transistor 41, that is, at an internal point C, via respective capacitors 7 and 8. The emitter follower transistor 41, the resistor 42, the base bias source 43 and the capacitor 44 are used as an impedance converter 4 for transmitting the signal at the junction point 11 to the internal point C. The emitters of transistors 5 and 6 are respectively connected to distinct two input ports of an output stage 9. The output stage 9 comprises a differential amplifier for deriving at the output port 14 the difference in voltage between the signals at the emitters of the transistors 5 and 6.

The frequency discriminating operation is now described. Two signals having their phases inverted to each other are applied to the bases of the transistors 5 and 6 through the internal points A and B, and the other signal obtained by shifting the signal at the internal point A is applied to the capacitors 7 and 8 through the internal point C. In this way, when the transistor 5 is conducting, a voltage obtained by subtracting the base-emitter forward voltage of the transistor 5 from the voltage corresponding to the vector difference between the voltages at the intenal points A and C is produced across the capacitor 7, while when the transistor 6 is conducting, a voltage obtained by subtracting the base-emitter forward voltage of the transistor 6 from the voltage coresponding to the vector difference between the voltages at the internal points B and C is produced across the capacitor 8. These voltages across the capacitors 7 and 8, respectively, are proportional to the potential differences between the internal points A and B, respectively, and the internal point C, that is, proportional to the peak potentials at the internal points A and B, respectively. It is to be noted that conduction of the transistors 5 and 6 arises alternately in every half period. These voltages across the capacitors 7 and 8 are applied to the differential inputs of an output stage 9. Then, the signal at the internal point C, which appears at the emitters of the transistors 5 and 6, will be cancelled by the differential amplifier in the output stage 9. Consequently, at the output port 14 of the output stage 9 is obtained a frequency-discriminated output as will be fully described hereunder.

The relation between a frequency $fi$ of the input signal and a resonant frequency $fo$ of the phase shifter 3 (or a center frequency $fo$ of the frequency discriminator circuit) is now described in more detail with reference to FIGS. 2(a), 2(b) and 2(c).

A phase shifting value $\theta$ of the phase shifter 3 can be readily derived on the basis of circuit theory, as follows:

$$\theta = 90° - \tan^{-1} Qx, \quad (1)$$

where $Q$ represents a quality factor of the tuned circuit 30, and $x$ is defined by the following equation:

$$x = (fi/fo) - (fo/fi) \approx (2\Delta f/fo) \quad (2)$$

where $\Delta f = fi - fo$. With regard to three different cases of the relation between the input signal frequency $fi$ and the resonant frequency $fo$ of the phase shifter 3, vector diagrams of the signals at the respective internal points A, B and C are shown in FIGS. 2(a), 2(b) and 2(c). In FIGS. 2(a), 2(b) and 2(c), reference symbol "O" represents a grounded point. As described above, since the output is obtained as a difference in scalar value between absolute values of a vector difference $\overline{AC}$ between the signals at the internal points A and C and a vector difference $\overline{BC}$ between the signals at the internal points B and C, if the input signal frequency $fi$ and the resonant frequency $fo$ are equal to each other (FIG. 2(a)), then the output is zero; if the resonant frequency $fo$ is smaller than the input signal frequency $fi$ (FIG. 2(b)), then the output is a positive (or a negative) value; and if the resonant frequency $fo$ is larger than the input signal frequency $fi$ (FIG. 2(c)), then the output is a negative (or a positive) value. In this way, as the frequency $fi$ of the input signal varies, the phase shifting value $\theta$ will change in response thereto, thus the output will be changed in polarity and in magnitude, and thereby frequency discrimination is achieved.

A description is now given in more detail with respect to the characteristic feature of the frequency discriminator according to the present invention. The capacities of the capacitors 31, 7 and 8 are very small with respect to the capacity of the capacitor 32, and are of the order of 0.2 - 10pF. For instance, the capacities are selected at 0.5pF for the capacitor 31 and at 5 - 6pF for the capacitors 7 and 8. Such low capacity condensers can be formed on a semiconductor chip. Accordingly, the electrode terminals required for a semiconductor chip except for those employed for voltage supply and input and output connections, is only one terminal that is necessitated at the junction 11 for additionally connecting the tuned circuit 30 of the capacitor 32 and the coil 33. Therefore, the circuit according to the present invention is not accompanied by enlarging of the semiconductor chip size and package size, or by a lowering in the degree of circuit integration density, and thus it is a highly suitable circuit arrangement for constructing in the form of an integrated circuit such as a semiconductor integrated circuit.

In addition, the necessary adjustment is only to adjust the resonant frequency $fo$ of the tuned circuit 30 to a predetermined value by changing the capacitance of the capacitor 32 with the aid of a sweeper or the like. The predetermined value is selected to the intermediate frequency for an FM radio receiver or to the frequency to be fixed for AFC use. Thus, the adjustment can be achieved quite easily, and difficult adjustment as in the case of the ratio detector system is unnecessary.

The detector output level is determined by the amplitude of the signal at the internal point A and B, that is, the output level of the input stage amplifier circuit 2, and the gain of the output circuit 9. On the other hand, it is known that the output off-set voltage of the output circuit 9 is normally proportional to the gain of the output circuit 9. Therefore, by lowering the gain of the output circuit 9 and enhancing the gain of the input stage amplifier 2, the output off-set voltage, that is, the fluctuation in output D.C. voltage can be suppressed to a low level without sacrificing the detection sensitivity. As a result of this feature, the frequency discriminator according to the present invention is highly suitable for use in a circuit for obtaining a D.C. output voltage such as an automatic frequency control (AFC) circuit or the like. Further, it is to be noted that the vector diagrams shown in FIGS. 2(a), 2(b) and 2(c) are almost the same as those of the Foster-Seeley frequency discriminator circuit which is considered to have the highest sensitivity, and so, the circuit arrangement according to the present invention provides a frequency discriminator circuit having a high sensitivity that is similar to that achieved in a Foster-Seeley discriminator.

Another embodiment of the present invention is described with reference to FIG. 3. The only difference from the first embodiment shown in FIG. 1 is in the 90° phase shifter 3' and the bias circuit for the transistor 41, and so, with regard to the other parts of the circuit arrangement, explanation will be omitted only by giving the same reference numerals as those used in FIG. 1. In more particular, to a junction point 12 connected to the internal point A is connected a coil 34 to which in turn a tuned circuit 30' consisting of a capacitor 32 and a coil 33 is connected. The junction between the coil 34 and the tuned circuit 30' is connected to the base of a transistor 41 via a junction point 13, and the other end of the tuned circuit 30' is grounded via a capacitor 44. In this case, the bias potential for the base of the transistor 41 is fed through the coil 34.

With respect to the modified circuit as described above, the frequency discriminating operation can be explained substantially in the same manner as the circuit shown in FIG. 1. It is to be noted that by applying the signal at the internal point A to the base of the transistor 41 through the coil 34 as shown in FIG. 3, the application to the base of the transistor 41 of the high frequency components such as the harmonics of the input signal caused by the distortion of the input stage amplifier 2 can be reduced, so that the detector distortion factor can be reduced to a very small value. According to this modified embodiment, only two electrode terminals are required besides the terminals for voltage supply and the terminals for input and output connections, and, therefore, this modified embodiment is also very suitable for formation as an integrated circuit in comparison to the Foster-Seeley frequency discriminator or the ratio detector which necessitates the use of 4 or 5 electrode terminals. Furthermore, the modified embodiment of FIG. 3 is similar to the first embodiment shown in FIG. 1 in that the detection sensitivity is high, the output off-set voltage is small, and adjustment is easy.

While preferred embodiments of the present invention have been described above, the invention should not be limited to these preferred embodiments, but the phase shifter circuit 3 or 3', for example, could be practiced in different circuit arrangements, and so long as the circuit can shift the phase of the signal obtained at the internal point A by 90° or approximately by 90°. It is to be noted that even if the magnitude of the phase shift should somewhat deviate from 90°, only the detection efficiency would be lowered and the circuit operation would not be substantially varied.

What is claimed is:

1. A frequency discriminator circuit comprising an input stage amplifier responsive to an input signal for obtaining a first signal at a first output port and a second signal at a second output port, said first and second signals having different phases from each other, means for shifting the phase of said first signal, a first transistor having said first signal applied to its base, a second transistor having said second signal applied to its base, first and second capacitors having their one ends connected to the respective emitters of said first and second transistors, means for applying the output of said phase-shifting means to the other ends of said first and second capacitors, respectively, and a differential amplifier output circuit having the respective emitter outputs of said first and second transistors applied to its inputs.

2. A frequency discriminator circuit claimed in claim 1, in which said first and second transistors are connected in a common collector circuit, and said phase shifting means shifts the phase of said first signal by 90°.

3. A frequency discriminator circuit claimed in claim 1, in which said phase-shifting means comprises a third capacitor connected at its one end to said first output port of said input stage amplifier and a tuned circuit having a predetermined resonant frequency and connected at its one end to the other end of said third capacitor and to said means for applying the output of said phase-shifting means.

4. A frequency discriminator circuit claimed in claim 1, in which said phase-shifting means comprises a coil connected at its one end to said first output port of said input stage amplifier and a tuned circuit having a predetermined resonant frequency and connected at its one end to the other end of said coil and to said means for applying the output of said phase-shifting means.

5. A frequency discriminator circuit claimed in claim 1, in which said means for applying the output of said phase-shifting means comprises an emitter-follower transistor having a base receiving said output of said phase-shifting means and an emitter coupled to said other ends of said first and second capacitors.

* * * * *